United States Patent [19]
Fujii et al.

[11] Patent Number: 6,058,950
[45] Date of Patent: May 9, 2000

[54] PRESSURIZED LIQUID-SUPPLY AND STRAIGHTENING MECHANISM IN A WATER-FLOW WASHING APPARATUS

[75] Inventors: Masashi Fujii; Yoshinobu Terui, both of Ayase, Japan

[73] Assignee: Speedfam Clean System Co., Ltd., Ayase, Japan

[21] Appl. No.: 09/136,508

[22] Filed: Aug. 19, 1998

[30] Foreign Application Priority Data

Sep. 2, 1997 [JP] Japan ..................................... 9-252704

[51] Int. Cl.[7] ....................................................... B08B 3/04
[52] U.S. Cl. .......................................... 134/182; 134/902
[58] Field of Search .................................... 134/182, 183, 134/902, 154, 186

[56] References Cited

U.S. PATENT DOCUMENTS 5,775,350   7/1998   Akanuma et al. ...................... 134/183
5,836,325  11/1998   Akanuma et al. ...................... 134/183

*Primary Examiner*—Philip R. Coe
*Attorney, Agent, or Firm*—Oblon, Spivak, McClelland, Maier & Neustadt, P.C.

[57] ABSTRACT

A straightening unit 13 including a first straightening vane 21 having a higher penetration resistance and a second straightening vane 22 having a lower penetration resistance is mounted in a box-shaped casing 12 in which only the end surface of said casing is open as an orifice for a washing liquid, thereby forming a sealed liquid-supply chamber 27 behind the straightening unit 13. When the washing liquid from the liquid-supply chamber 27 is passed through the straightening unit 13 under pressure, the first straightening vane 21 provides a uniform flow velocity regardless of the liquid depth, and the second straightening vane 22 alleviates turbulent flow of the washing liquid 5 to make it as uniform as possible.

6 Claims, 2 Drawing Sheets

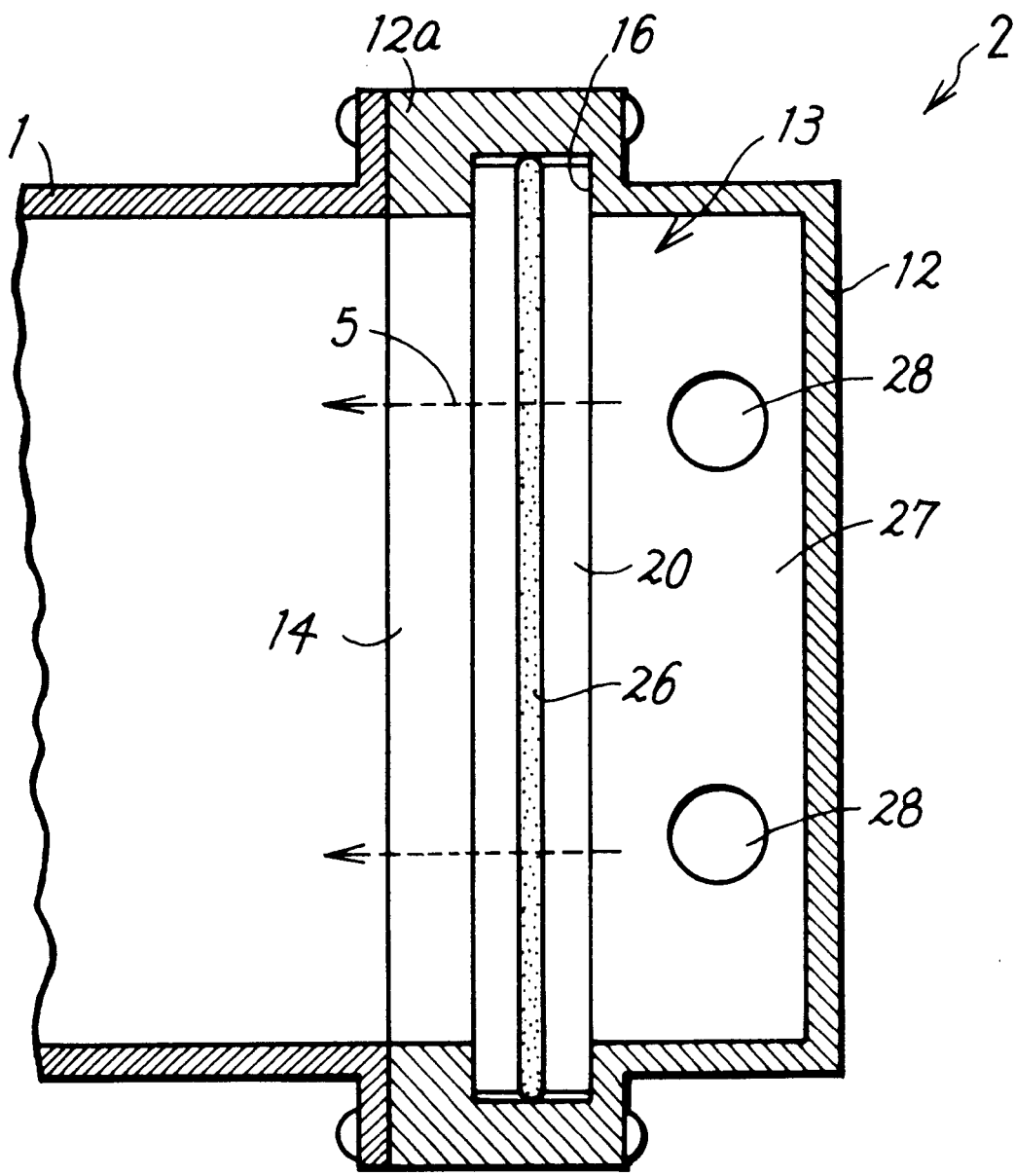

6,058,950

PRESSURIZED LIQUID-SUPPLY AND STRAIGHTENING MECHANISM IN A WATER-FLOW WASHING APPARATUS

FIELD OF THE INVENTION

The present invention relates to a pressurized liquid-supply and straightening mechanism used to obtain a uniform flow of a washing liquid in a water-flow washing apparatus for precisely washing workpieces such as semiconductor wafers, magnetic disc substrates, or other electronic, optical, or precision-mechanical parts that require water of extremely high purity.

PRIOR ART

Various types of water-flow washing apparatuses for washing a workpiece that is immersed in a uniform flow of a washing liquid have been proposed and disclosed in, for example, Japanese Utility Model Laid Open No. 61-130389 and Japanese Patent Application Laid Open No. 64-63086.

In such a washing apparatus, to prevent contaminants released from a workpiece from drifting with the turbulent flow of a washing liquid to reattach to the workpiece, porous straightening vanes having a plurality of through-holes shaped like circles or long slits are installed in a washing vessel so that the washing liquid passes through the straightening vanes to achieve a uniform flow (laminar flow) without turbulence.

Conventional washing apparatuses, however, balances the amounts of washing liquid supplied and discharged to generate a natural flow of the washing liquid in order to straighten the flow by means of the straightening vane installed in this natural flow. Thus, the difference in water pressure due to the depth of the liquid creates a difference in flow velocity between shallow and deep areas, thereby making it difficult to maintain a constant flow velocity regardless of the liquid depth. In addition, turbulent flow is likely to occur due to the difference in flow velocity.

DISCLOSURE OF THE INVENTION

It is a main technical object of this invention to provide a liquid-supply and straightening mechanism that has a high straightening effect and can generate a nearly uniform flow of a washing liquid before supplying it to a washing vessel.

It is another technical object of this invention to provide a liquid-supply and straightening mechanism that allows straightening vanes to be installed, removed, and replaced easily, and that is easy to handle and convenient in terms of maintenance and management.

To achieve these objects, a liquid-supply and straightening mechanism according to this invention is characterized in that a straightening unit including a first straitening vane having a higher penetration resistance and a second straightening vane having a lower penetration resistance is mounted in a box-shaped casing in which only its end surface leading to a washing vessel is open as an orifice for a washing liquid, and in that a liquid-supply chamber having a sealed structure entirely surrounded by the straightening unit and the casing is formed behind the straightening unit.

The first straightening vane allows the washing liquid to pass through under pressure to provide a uniform flow velocity regardless of the liquid depth, and the second straightening vane alleviates turbulent flow of the washing liquid to make it as uniform as possible. These straightening vanes are mounted in a single holding frame that is detachably mounted on the casing.

In a liquid-supply and straightening mechanism of this configuration, when a washing liquid is supplied to the liquid-supply chamber of a sealed structure, the penetration resistance of the first straightening vane in the straightening unit causes the washing liquid to fill the entire liquid-supply chamber in order to increase the pressure therein, and the liquid then flows out under pressure through the first straightening vane. At this point, the liquid pressure acts nearly evenly over the entire surface of the first straightening vane to make the exit velocity of the washing liquid generally equal, thereby providing a nearly even flow velocity regardless of the liquid depth.

Upon passing through the second straightening vane, the washing liquid, the flow velocity of which has been made nearly uniform by passage through the first straightening vane, has its turbulent flow mitigated to provide a nearly uniform flow, which then enters the washing vessel. Thus, the second straightening vane is desirably disposed on the downstream side of the first straightening vane.

According to a preferred embodiment of this invention, the first and second straightening vanes are formed of nonwoven cloth, the first straightening vane is pleated, and these straightening vanes are mounted on the holding frame in such a way as to be sandwiched by porous reinforcing plates on their respective sides.

According to another preferred embodiment of this invention, the casing has a rectangular cross section and has a closable insertion opening into which the straightening unit is inserted through its top plane; and a mounting groove in which the holding frame for the straightening unit is fitted. A seal member for sealing between the holding frame and the casing is provided on the outer circumference of the holding frame.

In addition, according to this invention, it is desirable that the liquid-supply and straightening mechanism be configured as a single independent member and detachably installed on the washing vessel.

BRIEF DESCRIPTION OF THE DRAWINGS

FIG. 3 is a sectional view taken along line III—III in FIG. 2.

DETAILED DESCRIPTION

Figure 1:
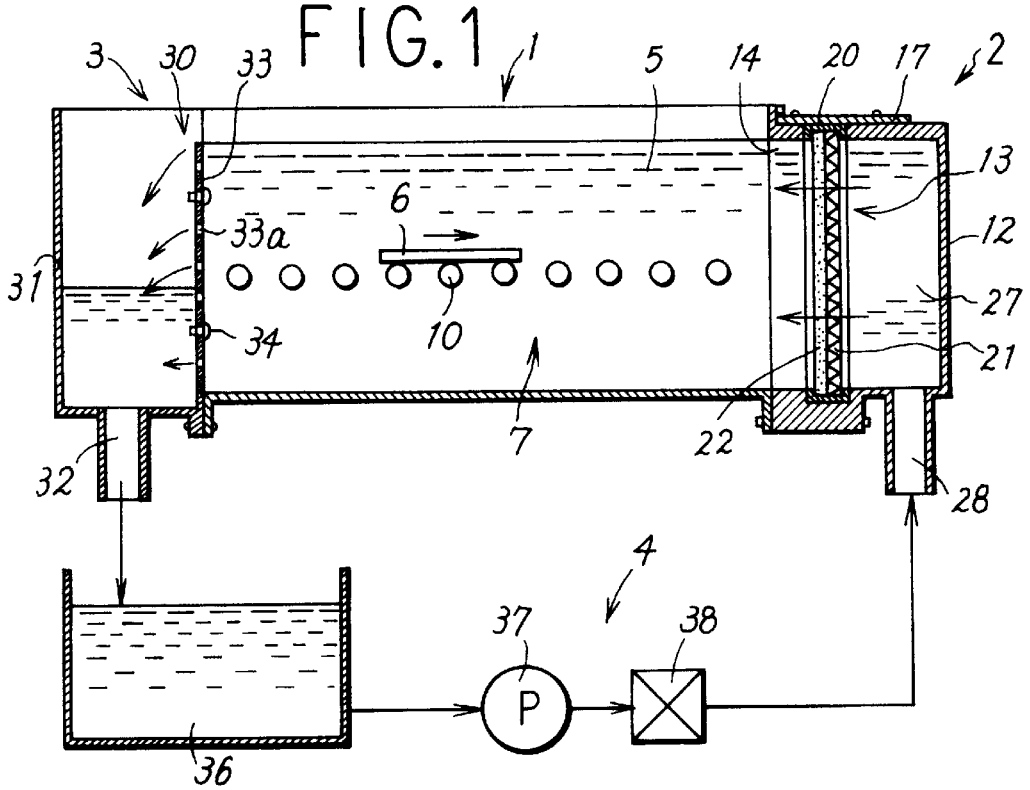
FIG. 1 is a vertical sectional view showing an example of a water-flow washing apparatus including a pressurized liquid-supply and straightening mechanism according to this invention.

FIG. 1 shows an example of a water-flow washing apparatus including a liquid-supply and straightening mechanism. This washing apparatus comprises a channel-shaped washing vessel 1; a liquid-supply and straightening mechanism 2 provided at one end of the washing vessel 1; a drainage mechanism 3 provided at the other end of the washing vessel 1; and a liquid-supply means for supplying a washing liquid to the liquid-supply and straightening mechanism 2. A workpiece 6 is immersed and washed in a washing liquid 5 flowing through the washing vessel 1 in the horizontal direction from the liquid-supply and straightening mechanism 2 toward the drainage mechanism 3 at a low speed (for example, 2 to 40 mm/sec).

In general, the washing liquid 5 is pure water, extra-pure water, or a chemically treated liquid, and is selected according to the workpieces to be washed.

The washing vessel 1 is formed of synthetic resin or metal so as to have a smooth internal wall surface, has an internal transfer means 7 that can transfer the workpiece 6 against a flow from the downstream side to the upstream side, and has on its bottom plane at least one supersonic irradiating means 8 for improving the washing effect. The supersonic irradiating means 8 is not necessarily required.

The transfer means 7 consists of a plurality of transfer rollers 10 that are rotatably attached to both side walls of the washing vessel 1 at a specified interval and are rotated by an electric motor (not shown) to transfer the workpiece 6 placed thereon. The transfer means 7, however, is not limited to these transfer rollers.

Figure 2:
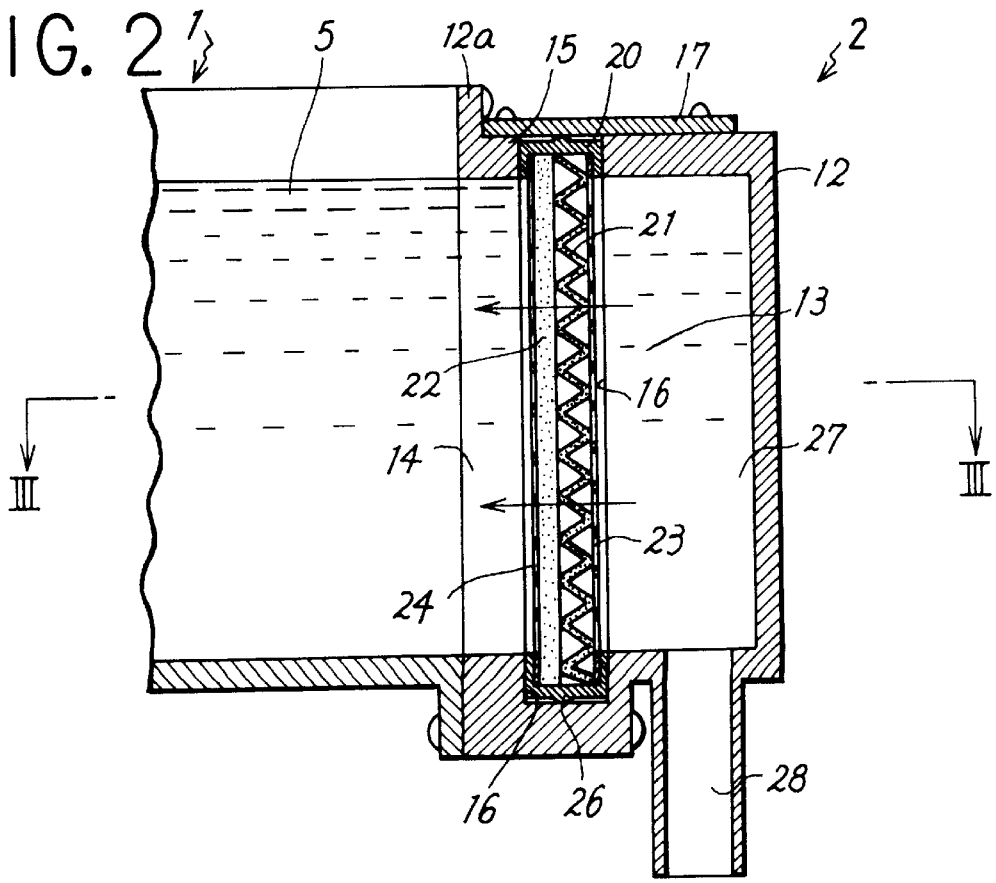
FIG. 2 is a schematic enlarged view of FIG. 1.

As shown in FIGS. 2 and 3, the liquid-supply and straightening mechanism 2 includes a casing 12 detachably mounted on the washing vessel 1 and a straightening unit 13 detachably mounted in the casing 12.

The casing 12 is formed of synthetic resin in the shape of an approximately rectangular box, and only its end surface 14 leading to the washing vessel 1 is open as an orifice for the washing liquid 5. A flange-like mounting portion 12a that is mounted on the washing vessel 1 is formed around the periphery of the end surface 14. In addition, an insertion hole 15 into which the straightening unit 13 is inserted is formed on the top plane of the casing 12, and a mounting groove 16 is formed in the inner surfaces of the side walls and the top surface of the bottom wall. The insertion opening 15 can be sealed with a cover 17 after the straightening unit has been mounted.

The straightening unit 13 is mounted in a rectangular synthetic-resin holding frame in such a way that a first porous straightening plate 21 having a higher penetration resistance and a second porous straightening plate 22 having a lower penetration resistance are sandwiched by porous and strong reinforcing plates 23 and 24 on their sides.

The first straightening plate 21 a is provided with a sufficiently high penetration resistance to obtain the required flow and flow velocity by passing the washing liquid 5 through the straightening plates under pressure. By passing the washing liquid 5 through the straightening plates under pressure, a nearly even liquid pressure acts on the entire straightening vane 21 to make the velocity of the washing liquid exiting the first straightening vane 21 generally uniform in order to provide a nearly even flow velocity regardless of the liquid depth. As shown in the figure, the first straightening vane 21 is desirably formed by a pleated nonwoven cloth having a high fiber density and thus a low percentage of voids. In this case, the fold may be horizontal, as shown in the figure, or vertical.

On the other hand, the second straightening vane 22 has sufficiently low penetration resistance to allow the washing liquid 5 exiting the first straightening vane 21 to pass through the second straightening vane while maintaining nearly the same flow and flow velocity. That is, the second straightening vane 22 alleviates a turbulent flow of the washing liquid 5 exiting the first straightening plate 21 to make it as uniform as possible. Thus, the second straightening vane 22 is desirably disposed on the downstream side of the first straightening vane 21. In addition, the second straightening vane 22 is preferably formed of a thick nonwoven cloth having a lower fiber density and thus a higher percentage of voids than the first straightening vane 21.

The reinforcing plates 23 and 24 have a sufficiently large opening area to not disturb the flow of the washing liquid 5 passing through the first and second straightening vanes 21 and 22, and has sufficient strength to protect the straightening vanes from water pressure. The reinforcing plates 23 and 24 can be formed of a perforated plate or net made of synthetic resin or metal, but the illustrated embodiment uses a perforated reinforcing plate 23 of high rigidity located on the first-straightening-plate-21 side, on which a high degree of water pressure acts; and the reinforcing plate 24 made of a net with a large opening area located on the second-straightening-plate-22 side, from which the straightened washing liquid 5 is discharged.

The holding frame 20 is formed so as to have a thickness almost as great as the depth of the mounting groove 16 provided in the casing 12 so as not to protrude into the channel. This configuration prevents the holding frame 20 from disturbing the flow of the washing liquid 5. A seal member 26 is provided on the outer circumference of the holding frame 20 to seal between the holding frame 20 and the casing 12.

When the straightening unit 13 is mounted in the casing 12, a liquid-supply chamber 27 with a sealed structure entirely surrounded by the straightening unit 13 and the casing 12 is formed behind the straightening unit 13. A liquid-supply opening 28 is provided in the bottom plane of the liquid-supply chamber 27 and the liquid-supply means 4 is connected to the liquid-supply opening 28.

On the other hand, the drainage mechanism 3 provided opposite the washing vessel 1 consists of a straightening means 30 with an opening that can be freely adjusted; and a drainage vessel 31 that receives the washing liquid 5 that flows down after passing through the straightening means 30, and that discharges it through a drainage opening 32.

The straightening means 30 consists of a perforated metallic plate 33 having a plurality of through-holes 33a drilled therein; and a plurality of plugs that can be used to selectively occlude any through-holes. The perforated plate 33 is disposed at such a height that some of the washing liquid 5 overflows from the top of the plate.

The liquid-supply means 4 is configured so as to allow the washing liquid 5 to be recycled, and has a reservoir tank 36 that receives the washing liquid 5 discharged through the drainage opening 32 in the drainage mechanism 3; a liquid-supply pump 37 that force-feeds the washing liquid 5 in the reservoir tank 36 into the liquid-supply and straightening mechanism 2; and a filter 38 that purifies the washing liquid 5. The liquid-supply means 4, however, is not limited to the above and can constantly supply new washing liquid to the supply-liquid and straightening mechanism 2 while feeding to a separate processing facility used washing liquid discharged from the drainage mechanism 3.

In a washing apparatus of the above configuration, when the washing liquid 5 is supplied to the liquid-supply chamber 27 with a sealed structure in the liquid-supply and straightening mechanism 2, the higher penetration resistance of the first straightening plate 2 in the straightening unit 13 causes the washing liquid 5 to fill the entire liquid-supply chamber 27 in order to increase the pressure therein, and the liquid then flows out through the first straightening vane 21 under pressure. At this point, the liquid pressure nearly evenly acts on the entire surface of the first straightening vane 21 to make the exit velocity of the washing liquid 5 generally uniform, thereby providing a nearly even flow velocity regardless of the liquid depth.

Upon passing through the second straightening vane 22, the washing liquid 5, the flow velocity of which has been made nearly uniform due to passage through the first straightening vane 21 under pressure, has its turbulent flow mitigated to provide a nearly uniform flow, which then enters the washing vessel 1.

In the washing vessel 1, the workpiece 6 is placed on the transfer rollers 10 on the downstream side by a handling means (not shown), and is washed while being transferred toward the upstream side against the flow. The workpiece 6 is then picked up from the washing vessel 1 at its upstream end.

Contaminants released from the workpiece 6 are ensured to drift with the uniform flow of the washing liquid 5 to leave the workpiece 6 and then be discharged from the drainage mechanism 3 together with the washing liquid 5, without reattaching to the workpiece 6.

If the straightening vanes 21 or 22 of the straightening unit 13 in the liquid-supply and straightening mechanism 2 are clogged or if a different flow or flow velocity of the washing liquid 5 is desired, the straightening unit 13 may be removed from the casing 12 and replaced with another unit. The replacement can be performed simply and easily by removing the straightening unit 13 from the insertion opening 15 and inserting a new straightening unit into the opening 15, making this unit easy to handle and convenient in terms of maintenance and management.

According to this embodiment, the straightening unit 13 in the liquid-supply and straightening mechanism 2 includes two straightening vanes, that is, the first and second straightening vanes 21 and 22. The unit 13, however, must include at least two such straightening vanes, and one or more additional straightening vanes made of nonwoven cloth or perforated plates may be integrated into the unit.

As described above, the pressurized liquid-supply and straightening mechanism according to this invention includes a liquid-supply chamber of a sealed structure that pressurizes the washing liquid, a first straightening vane having a higher penetration resistance to pass the washing liquid through under pressure in order to provide a uniform flow velocity regardless of the liquid depth, and a second straightening vane having a smaller penetration resistance to alleviate turbulent flow of the washing liquid in order to make the flow as uniform as possible. Thus, this mechanism has a high straightening effect because it can generate a nearly uniform flow of the washing liquid, regardless of the depth of the liquid, before supplying it to the washing vessel.

In addition, the first and second straightening vanes are mounted on a single holding frame as one unit, and this straightening unit is detachably installed in the casing, making the straightening vanes are easy to install, remove, and replace, and making this mechanism easy to handle and convenient in terms of maintenance and management.

What is claimed is:

1. A pressurized liquid-supply and straightening mechanism in a water-flow washing apparatus comprising:

a box-shaped casing having an end surface that leads to a washing vessel and that is open as an orifice for a washing liquid;

a straightening unit including at least a first porous straightening vane having a higher penetration resistance to pass the washing liquid through under pressure in order to provide a uniform flow velocity regardless of the liquid depth, and a second porous straightening vane having a lower penetration resistance to alleviate turbulent flow of the washing liquid in order to make the flow as uniform as possible, with the straightening vanes being mounted on one holding unit, the straightening unit being detachably mounted in said casing;

a liquid-supply chamber formed behind the straightening unit in such a way as to be entirely surrounded by the straightening unit and casing, with the liquid-supply chamber causing the washing liquid to exit the first straightening vane of the straightening unit under pressure; and a liquid-supply opening opened into said liquid supply to introduce the washing liquid from a liquid-supply pump into the liquid-supply chamber.

2. A liquid-supply and straightening mechanism according to claim 1 wherein in said straightening unit, the first straightening unit is disposed on the upstream side of the second straightening unit.

3. A liquid-supply and straightening mechanism according to claim 2 wherein the first and second straightening vanes of said straightening unit are formed of nonwoven cloth, with the first straightening vane being pleated, the straightening vanes being mounted on said holding frame in such a way as to be sandwiched by porous reinforcing plates on their sides.

4. A liquid-supply and straightening mechanism according to any of claims 1 to 3 wherein said casing has a rectangular cross section and has in its inner surface a mounting groove in which the holding frame for the straightening unit is fitted, and wherein a seal member that seals between the holding frame and the casing is provided on the outer circumference of the holding frame.

5. A liquid-supply and straightening mechanism according to claim 4 wherein the liquid-supply and straightening mechanism is formed as a single independent member separate from the washing vessel and is detachably installed at the end of the washing vessel.

6. A liquid-supply and straightening mechanism according to any of claims 1 to 3 wherein the liquid-supply and straightening mechanism is formed as a single independent member separate from the washing vessel and is detachably installed in the washing vessel.

* * * * *